United States Patent [19]

Rotker et al.

[11] Patent Number: 5,444,717
[45] Date of Patent: Aug. 22, 1995

[54] METHOD FOR PROVIDING MINIMAL SIZE TEST VECTOR SETS

[75] Inventors: Paul S. Rotker, West Newton; Nicholas A. Warchol, Boxborough, both of Mass.

[73] Assignee: Digital Equipment Corporation, Maynard, Mass.

[21] Appl. No.: 993,339

[22] Filed: Dec. 18, 1992

[51] Int. Cl.6 .......................................... G01R 31/3183
[52] U.S. Cl. .......................................... 371/27; 364/580
[58] Field of Search ................. 371/27, 22.3, 22.4, 371/23, 24; 364/488, 489, 580; 324/500, 527, 537

[56] References Cited

U.S. PATENT DOCUMENTS

| | | | |
|---|---|---|---|
| 4,500,993 | 2/1985 | Jacobson | 371/22.6 |
| 4,862,399 | 8/1989 | Freeman | 371/24 |
| 5,072,178 | 12/1991 | Matsumoto | 371/22.1 |
| 5,097,468 | 3/1992 | Earlie | 371/15.1 |
| 5,323,401 | 6/1994 | Maston | 364/580 |
| 5,341,315 | 8/1994 | Niwa et al. | 364/580 |

Primary Examiner—Emanuel T. Voeltz
Assistant Examiner—Edward J. Pipala
Attorney, Agent, or Firm—Arthur W. Fisher; Denis G. Maloney; Lindsay G. McGuinness

[57] ABSTRACT

A method of testing an integrated circuit having a plurality of pins includes the steps of providing a functional test set having an ordered group of test strings wherein each element of the test string is related to one of the pins of said integrated circuit. The group of test strings is searched to locate a sequence of test strings having a undesirable pattern. The undesirable pattern can be a pattern in which none of the elements associated with the test string changes or a pattern in which a reference element and at least one other element of the test string changes. When a sequence of test strings having the undesirable pattern is located, the group of test strings is processed to correct the undesirable pattern. When all the vector sequences having an undesirable patterns are corrected, the group of test vectors is applied to the input pins of the integrated circuit.

16 Claims, 5 Drawing Sheets

| $P_0$ | $P_1$ | $P_2$ | $P_3$ | $P_4$ | $P_5$ | $P_6$ | $P_7$ | $P_8$ | $P_9$ | $P_{10}$ | $P_{11}$ | $P_{12}$ | $P_{13}$ | $P_{14}$ | $P_{15}$ |
|---|---|---|---|---|---|---|---|---|---|---|---|---|---|---|---|
| 0 | 1 | 0 | 0 | 1 | 0 | 1 | 0 | 1 | 1 | 1 | 0 | 0 | 1 | 0 | 1 |
| 1 | 0 | 0 | 0 | 0 | 1 | 0 | 0 | 0 | 0 | 1 | 1 | 1 | 1 | 0 | 1 |
| 1 | 0 | 0 | 0 | 0 | 1 | 0 | 0 | 0 | 0 | 1 | 1 | 1 | 1 | 0 | 1 |
| 0 | 1 | 1 | 0 | 1 | 0 | 0 | 1 | 1 | 1 | 0 | 1 | 0 | 0 | 1 | 0 |
| 0 | 1 | 1 | 1 | 0 | 0 | 0 | 1 | 0 | 0 | 1 | 1 | 0 | 0 | 1 | 0 |
| 1 | 0 | 0 | 0 | 1 | 0 | 1 | 1 | 1 | 0 | 0 | 1 | 0 | 0 | 1 | 0 |
| 0 | 1 | 1 | 0 | 0 | 0 | 1 | 0 | 1 | 1 | 0 | 1 | 1 | 1 | 0 |
| 0 | 1 | 1 | 0 | 1 | 0 | 0 | 1 | 1 | 0 | 1 | 0 | 1 | 1 | 1 | 0 |
| 1 | 0 | 0 | 1 | 1 | 0 | 0 | 1 | 1 | 0 | 0 | 1 | 1 | 0 | 0 | 1 |
| 1 | 1 | 0 | 0 | 1 | 1 | 0 | 0 | 1 | 1 | 0 | 0 | 1 | 1 | 0 | 0 |
| 1 | 1 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 |
| 0 | 1 | 1 | 0 | 0 | 1 | 0 | 0 | 0 | 1 | 1 | 1 | 1 | 0 | 0 | 0 |
| 0 | 1 | 1 | 0 | 0 | 0 | 0 | 1 | 0 | 0 | 0 | 1 | 1 | 1 | 0 | 1 |
| 1 | 0 | 0 | 1 | 1 | 0 | 1 | 0 | 1 | 1 | 1 | 0 | 1 | 1 | 0 | 1 |
| 1 | 0 | 0 | 1 | 1 | 0 | 1 | 0 | 1 | 1 | 0 | 0 | 1 | 1 | 0 | 1 |

METHOD FOR PROVIDING MINIMAL SIZE TEST VECTOR SETS

FIELD OF THE INVENTION

This invention relates generally to integrated circuits and more specifically to testing integrated circuits.

BACKGROUND OF THE INVENTION

As it is known in the art, a plurality of integrated circuits are generally fabricated on a common wafer and cut i.e. diced into individual integrated circuit chips or dies. Some or all of these integrated circuits are generally tested to ensure that the integrated circuits function as anticipated. One common way of ensuring that an integrated circuit chip operates as expected is through the use of a chip tester apparatus.

The chip tester apparatus when used to test packaged integrated circuit chips, for example, includes a socket having a plurality of hollow pins to hold and electrically connect to pins of a packaged integrated circuit under test. Generally the pin positions of the socket correspond to respective input and output terminals of the integrated circuit. The chip tester apparatus also includes a Read Only Memory (ROM) device used to store a set of test vectors which are fed to the integrated circuit under test. Each test vector includes a given number of binary bits elements, and each bit corresponds to a pin on the respective integrated circuit. For example, a test vector which is used to test a 16 pin integrated circuit would include 16 binary bits.

For the bits which correspond to the input terminals of the integrated circuit, the value of the bit is representative of the digital value (i.e. logic '1' or logic '0') which is to be applied to the input of the integrated circuit. Whereas, for the bits which correspond to the output pins of the integrated circuit, the value of the bit is representative of the digital value which is expected at the corresponding output of the integrated circuit.

The tester apparatus additionally includes a processor to control the application of the test vectors stored in the memory device to the integrated circuit. Each test vector is applied to the integrated circuit for a given time interval, which is largely dictated by the speed of the processor. The processor is coupled to both the integrated circuit socket and the ROM socket so that during each time interval the processor receives both the expected output pin values, as designated by the bits of the test vector set provided from the ROM, as well as the actual output pin values provided by the integrated circuit. In the event that a miscompare occurs between a bit value and a output pin value, the processor indicates that there is a fault within the integrated circuit device.

One technique for generating test sets involves identifying the functional blocks within the integrated circuit and generating subtests which exercise each identified functional block. Subtests are commonly generated through the use of computer simulation tools. A computer model of the integrated circuit is provided, and transactions which exercise the functional blocks of the integrated circuit are simulated. The signals which are provided to the input pins, and which appear at the output pins are "captured", that is their values at given time intervals are saved in a file for subsequent application to an actual integrated circuit during testing thereof.

One type of logic circuit commonly tested is a so-called synchronous logic circuit which has at least one reference signal generally referred to as a clock signal from which input signals and output signals are in general synchronized. While a synchronous logic integrated circuit may be simulated at any clock speed, the values of the input pins and output pins are usually "captured" at the midpoint of each half cycle of the clock signal, to ensure that the data which is captured is stable.

One drawback in the method of capturing the test vector at the midpoint of each half cycle of the clock signal in synchronous logic integrated circuits is that the captured vectors are already stable and thus the vectors do not reflect actual propagation delays and 'setup' and 'hold' conditions between and for the assertions of various signals.

TABLE 1

| | ACTUAL DATA | |
|---|---|---|
| Time (ns) | Clock | Data |
| 0 | 0 | 0 |
| 6 | 0 | 1 |
| 10 | 1 | 1 |
| 30 | 0 | 1 |
| 44 | 0 | 0 |
| 50 | 1 | 0 |

TABLE 2

| | SAMPLED DATA | |
|---|---|---|
| Time (ns) | Clock | Data |
| 0 | 0 | 0 |
| 20 | 1 | 1 |
| 40 | 0 | 1 |
| 60 | 1 | 0 |

By way of example, referring now to Table 1, a 50% duty cycle clock signal having a 40 nano-second (ns) period may be used to clock a flip flop (not shown) which is triggered by the rising edge of the clock signal. As shown in Table 1, the clock becomes asserted at 10 ns, remains asserted for 20 ns, (deasserting at time equal to 30 ns), and remains deasserted for the following 20 ns (asserting again at time equal 50 ns). A data signal which is to be received by the flip flop is provided so as to satisfy the setup and hold characteristics of the flip flop, by arriving a time period $\tau$ ns before the triggering edge of the clock, and remaining stable for at least a time period $\lambda$ ns after the triggering edge of the clock. For example, for the given flip flop $\tau$ may equal to 3 ns and $\lambda$ may equal to 2 ns. A data signal which would satisfy the setup and hold criteria for the flip flop is shown in Table 1 as becoming asserted at 6 ns, (4 ns before the clock becomes asserted), and remaining asserted until the 44 ns time interval, at which point the signal deasserts.

Referring now to Table 2, the sampled data obtained by using the above described technique of sampling the data and clock at the midpoint of each half-cycle of the clock period is shown. The result is a sampling of the clock and data signals at 20 nano-seconds (ns), 40 ns, and 60 (the midpoints between the 10 ns, 30 ns and 50 ns clock edges described with reference to Table 1).

When the signal values of Table 2 are used by the tester apparatus, it can be seen that at the 20 ns interval and the 60 ns interval the value of the clock pin and the value of the data pin change virtually simultaneously. If the clock pin and data pin both change in the same test vector on a test apparatus, either the set-up time or the hold time of the state device which receives the clock and data could be violated. Consequently, the input state devices of the integrated circuit being tested would not receive the correct data, and the output pins of the integrated circuit would therefore provide incorrect results. In such an instance, imperfect test vectors may cause a perfect integrated circuit to fail on the tester apparatus.

One technique used to avoid the above described situation is to ensure that during a simulation of the circuit that the clock pins and data pins always change in separate test vectors. This is accomplished by capturing a vector at the exact moment that one of the input data pins or the clock pin changes values during the simulation. Although this technique is effective, one problem with this technique is that it increases the number of test vectors that are produced, since not every data pin will change at the exact same instant. Large test sets are undesirable because the longer a test set is, the longer it takes to test the integrated circuit, and thus the testing period and hence cost for the integrated circuits is increased. An additional problem arises in that most testing apparatus can store only a fixed number of test vectors in the ROM. Therefore, it may not be possible to capture the vectors on every clock and data change and still have enough room in the ROM to completely test the integrated circuit.

A second type of logic circuit is a so called asynchronous logic integrated circuit. In general with these types of circuits outputs are related to present states of inputs without being synchronized by a reference signal. Often in these types of circuit it is important that signals change in a specified order or that the input signals do not change at the same time. Asynchronous logic circuits are also often tested by applying simulation generated data as generally mentioned above, and accordingly there is the associated problem in test set generation of providing a test set which correctly identifies a faulty asynchronous integrated circuit while utilizing as few test vectors as possible.

SUMMARY OF THE INVENTION

In accordance with the present invention, a method of testing an integrated circuit having a plurality of pins includes the steps of providing an ordered group of test strings, each string having a plurality of elements, with each element of the test string corresponding to one of the pins of the integrated circuit and searching the group of test strings to locate a sequence of test strings having an undesirable pattern. The undesirable pattern can be a pattern in which none of the elements associated with the test string changes or a pattern in which a first reference element and at least one other element of the test strings changes. When a sequence of test strings having the undesirable pattern is located, the group of test strings is processed to correct the undesirable pattern. When all the vector sequences having undesirable patterns are corrected, the group of test vectors is applied to the input pins of the integrated circuit. With such an arrangement, sequences of test strings which may cause a perfectly functional integrated circuit to fail on the test apparatus are corrected. Additionally, by modifying only selected portions of the test set to correct the undesirable patterns, the number of test strings in the test set is kept to a minimum.

In accordance with a further aspect of the present invention, the method of locating a sequence of undesirable patterns includes the steps of identifying pins of the integrated circuit related to the first reference element and locating ordered pairs of first and second test strings, having the element values of the first reference element and at least one of the related elements values both differing in the second test string of the test string pair relative to the first test string of the ordered test string pair. In order to correct setup time violations, the group of test vectors is corrected by providing a third test string having element values matched to the second test string and inverting the element value of the first reference element of the third test string, and inserting the third test string between the first test string and the second test string in the ordered group of test strings. To correct hold time violations, the group of test vectors is corrected by providing a third test string having element values matched to the second test string and inverting the element value of the first reference element of the third test string, and inserting the third test string between the second test string and a subsequent test string. With such an arrangement, test sequences which could possibly result in setup and hold time violations in the integrated circuit being tested are identified and corrected to ensure that the test set is free of sequences which could cause a perfectly functional integrated circuit to fail on the tester apparatus.

In accordance with a further aspect of the present invention, the technique of locating a sequence of undesirable patterns includes the steps of locating sequential test string pairs having identical element values. In this arrangement, the step of correcting the group of test vectors includes the step of removing the second test string having element values identical to the first test string from the group of test strings. With such an arrangement, redundant test strings are removed from the test set and thus a minimal size test set capable of thoroughly testing the integrated circuit is provided.

DESCRIPTION OF THE PREFERRED EMBODIMENT

Figures 1, 2:
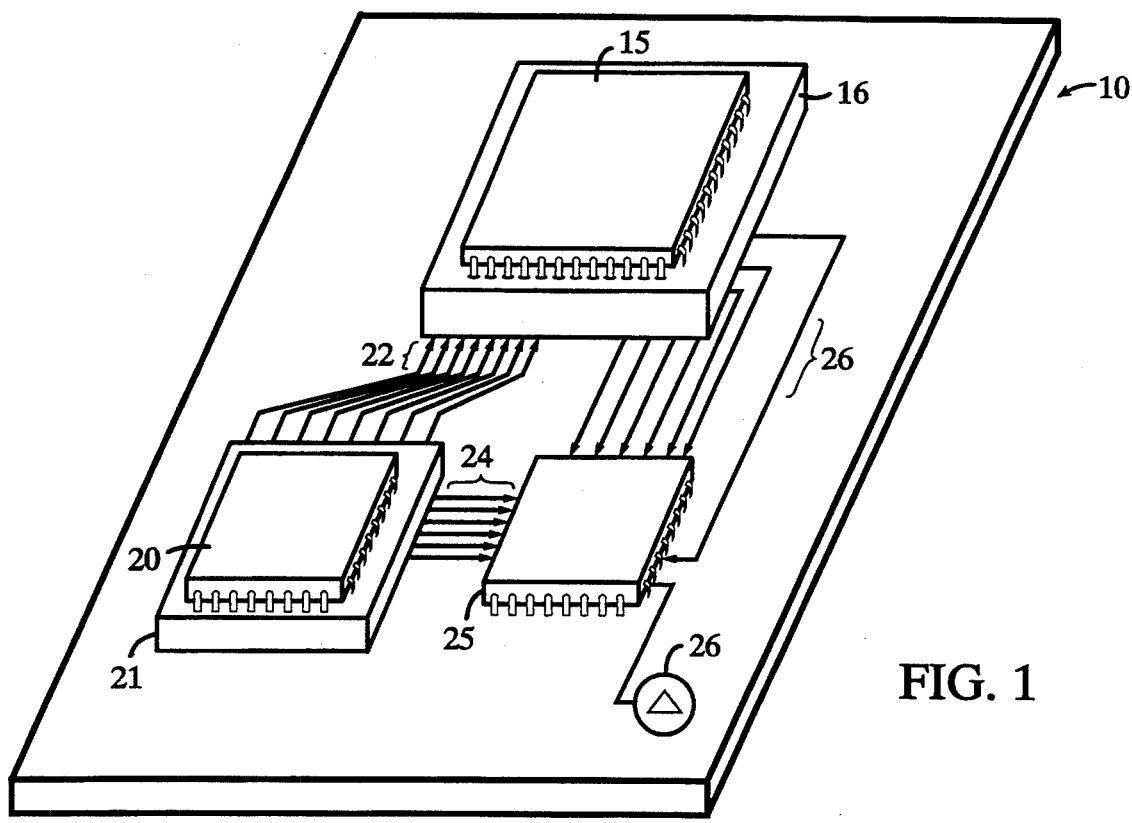
FIG. 1 illustrates a tester apparatus including a ROM for storing a test vector set provided by the present invention.
FIG. 2 illustrates an example of a test vector set stored in the ROM device of FIG. 1.

Referring now to FIG. 1, a portion of test apparatus 10 for testing an integrated circuit chip 15 is shown. The integrated circuit 15 is here disposed in a socket 16 mounted on the test apparatus 10. The socket 16 is a custom socket in accordance with the particular integrated circuits designed to provide data to a particular corresponding pin of the integrated circuit 15. The integrated circuit 15 and socket 16 are coupled via lines 22 to a memory device 20.

The memory device 20 is shown here disposed in a socket 21. The memory device 20 contains a set of test vectors. Each test vector includes a binary element for each input or output pin of the integrated circuit 15. The binary element corresponds to a logical digital signal value. The memory device 20 provides digital signals via lines 22 to each of the corresponding input pins of the integrated circuit 15. The memory device 20 is also coupled to a processor 25 via lines 24 to provide digital signals to the processor 25.

The processor 25 is also coupled to receive data from the integrated circuit 16 via lines 26. The processor 25 operates to test the integrated circuit 15 as follows. The processor 25 provide information to address the ROM 20 to output a test vector providing input signals to the integrated circuit 15 via lines 22 and expected output signals to the processor 25 via lines 24. These signals on lines 24 correspond to the expected outputs from the integrated circuit 15 in response to the input signals provided thereto from ROM 20.

In response to these input signals, the integrated circuit 15 provides actual signals via output lines 26 to the processor 25. The processor 25 compares the actual signals on lines 26 with the expected results on lines 24 to determine if there is a fault condition in the integrated circuit 15. If there is no fault condition, the processor 25 increments an address pointer and addresses the next ROM location and in response a new test vector with different input signals and expected output signals is provided. If there is a fault condition, the processor 25 lights the LED 26 to indicate that there is a fault in the particular integrated circuit 15.

Referring now to FIG. 2, a typical test vector set stored in a memory device is shown. In this example, it is to be assumed that the integrated circuit is a 16-pin device, and therefore the test vector includes 16 corresponding bit elements (labeled P0–P15 in FIG. 2), although it is to be understood that the width of the test vector reflects the number of logical input and output pins of the integrated circuit. In this example bit elements p0–p10 are considered to be the bit elements corresponding to the input pin signals of the integrated circuit while bit elements p11–p15 are considered to be the bit elements corresponding to the output pin signals of the integrated circuit.

Each bit element of the test vector represents a digital signal value of 0 or 1 which is applied to a pin of the integrated circuit 15 for a specified time period. The time period is dictated by the speed of the processor 25. Each test vector is sequentially applied to the integrated circuit 15 until the entire test set has been exhausted, at which point, if no error has been flagged by the processor 25, the integrated circuit 15 is presumed to be fully operative.

Figure 3:
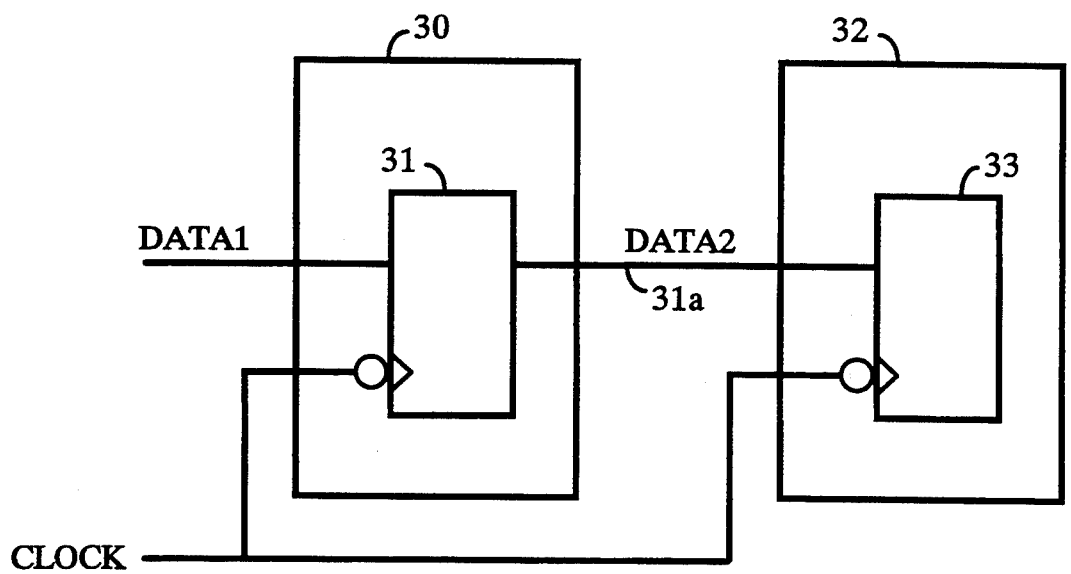
FIG. 3 is a block diagram illustrating the transfer of data between integrated circuits.

Referring now to FIG. 3 it is to be noted that the integrated circuit 15 which is tested by the tester apparatus is intended to be placed on a printed circuit board to communicate with other hardware components. As such, in simulation the transfers between a gate array and the integrated circuit 15 which is being tested should be simulated correctly. For example, a gate array 30 includes a state device 31 which is used to transmit data on bus 31a to a gate array 32. A state device 33, is provided to receive data from gate array 30 in the subsequent clock cycle. The state devices 31 and 33, which may be D-type flip flops as illustrated here, are triggered by the falling edge of the clock.

Figure 4:
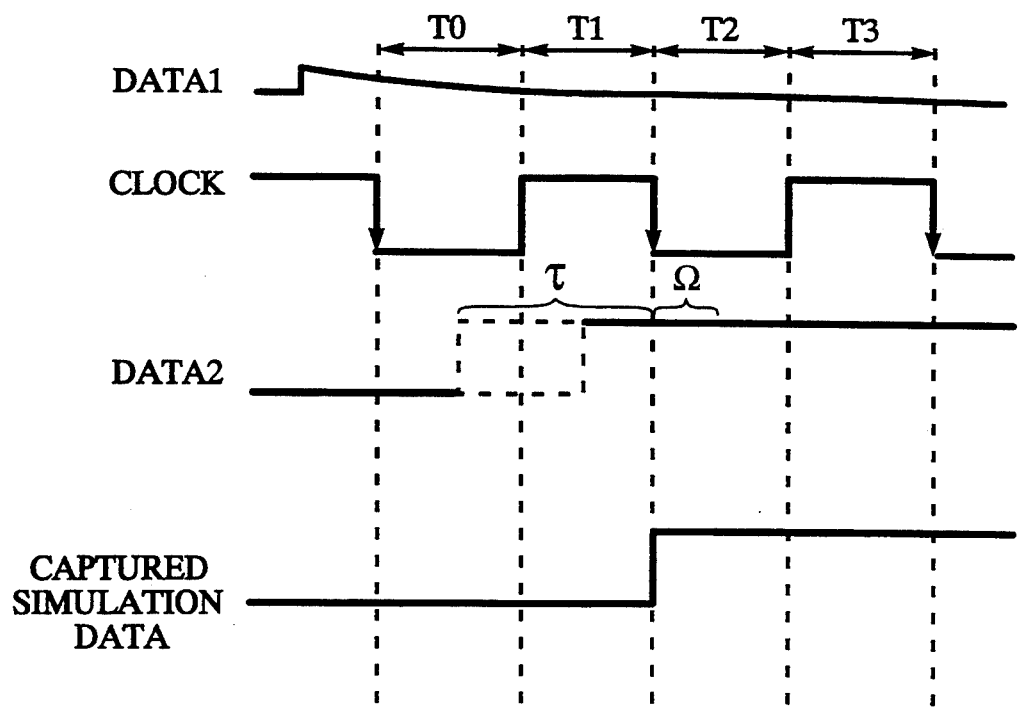
FIG. 4 is a timing diagram illustrating the transfer of data between the integrated circuits of FIG. 3.

Referring now to FIG. 4 an actual transaction between gate array 30 and 32 is shown in the form of a timing diagram. State devices 31 and 33 are low-edge triggered, that is the state devices 31 and 33 receive data into the state device during the falling edge of the clock. As shown in FIG. 4, at time T0 state device 31 receives DATA1 on line 130, and when the signal CLOCK falls, DATA1 is latched at the input stage of flip flop 31. DATA1 is passed to the output stage of flip flop 31, thereby asserting the DATA2 signal. The time delay associated with the assertion of the DATA2 signal is given by the propagation characteristics of the flip flop. A certain time delay, or skew is associated with the transfer of DATA2 between state device 31 and 33. This time delay is a function of the time difference between the assertion of the CLOCK signal at state device 31 and 33, as well as the delay associated with transmitting DATA1 over line 31a. The skew is depicted by the phantom portion of the DATA2 signal.

As it is know in the art, state devices operate under certain constraints. For example, for data to be transferred to a state device, it must satisfy a certain set-up time, that is the time required for the input data to settle before the triggering edge of the clock. Therefore, in order to transfer DATA2 between flop 31 and flop 33, DATA2 must be stable before the start of time period T2, when the signal CLOCK is again deasserted. The data stable period is indicated by the letter $\tau$ in FIG. 4. In addition, a hold-time criteria must be satisfied. Hold time is time period for which the data must remain stable after the triggering edge of the state device. The hold-time criteria for the state devices is indicated by the $\lambda$ in FIG. 4.

However, due to the way that test vectors are provided during a simulation of an integrated circuit, there is a possibility that the data signals and the clock signals could change in the same test vector. Because each test vector is applied so that the digital signals represented by the bit elements are asserted at the pins at roughly the same instant, the set-up and hold-time of the receiving state devices within the integrated circuit 15 may not be satisfied. This would result in a condition which would provide an uncertainty as to whether the data actually reaches the state device, and could therefore cause the integrated circuit 15 to fail on the tester apparatus. This is undesirable, since an integrated circuit should only fail due to a fault within one of its functional blocks.

The present invention overcomes the above problem without unduly enlarging the test vector set. As mentioned previously, test vectors are generated by identifying the functional blocks within an integrated circuit and then providing a computer simulation of the integrated circuit which includes the functional blocks. The simulation model is built of the integrated circuit and test code is written which will cause all of the functional blocks within the integrated circuit 15 to be exercised.

As the simulation model runs the test code, the values on the input pins and output pins are sampled. One illustrative technique to capture the data is to sample the signal values on the input pins and output pins at the mid-point of each clock assertion. For example, for a simulation running at 40 ns, with a 50% duty cycle clock, the clocking waveform would appear to be high for 20 ns and low for 20 ns. The input pins values and output pins values would be sampled at 10 ns and 30 ns. By sampling the inputs, or "capturing" the vectors in this manner, the smallest number of test vectors which represent the clock transitions is obtained. However, as discussed previously, a possibility of hazards within the test set exists, because any time difference between the assertion of the data and the assertion of the clock is not captured in the test set. However, other sampling criteria could alternatively be used.

Figure 5:
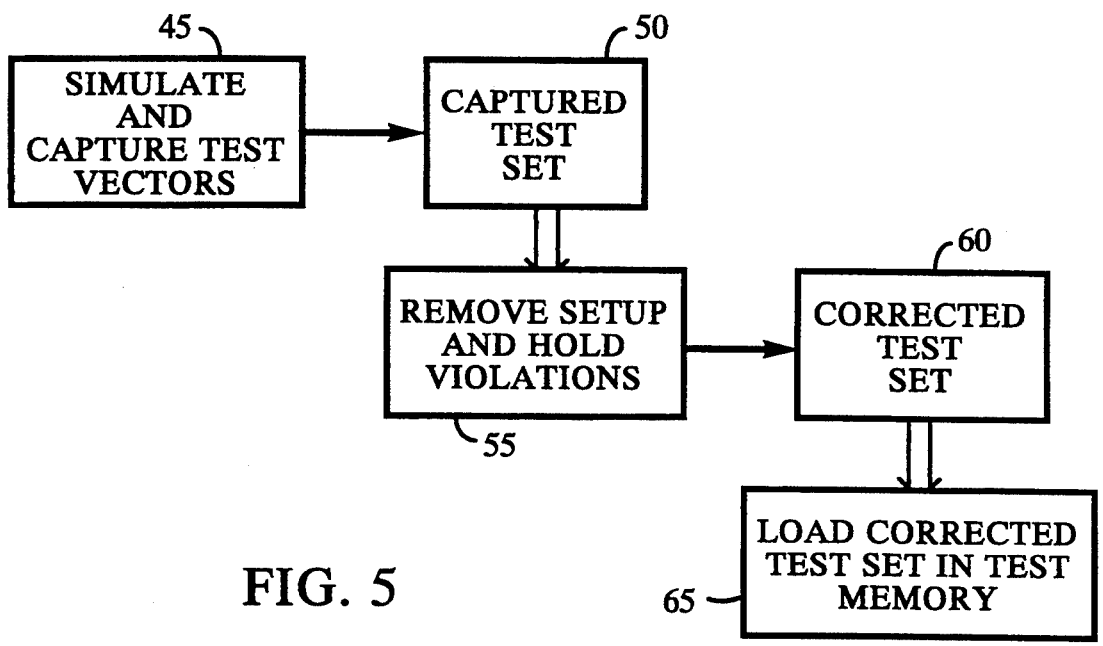
FIG. 5 is a block diagram illustrating one embodiment of the method of the present invention for providing a test vector set for use in the tester apparatus of FIG. 1.

Referring now to FIG. 5, a method for testing an integrated circuit using a test set free from hazards conditions is shown. At step 45 the functional test code is simulated and the test vectors (possibly containing hazards) are captured as mentioned previously at the midpoint of each clock assertion. The captured test set 50 is processed by a processor block 55 to remove all the hazard conditions that exist in the captured test set, storing the result as the "hazard free" test set at step 60. This hazard free test set from step 60 is loaded into the test memory 20 (FIG. 1), to provide a test set which will not erroneously indicate an error in the integrated circuit.

Figure 6:
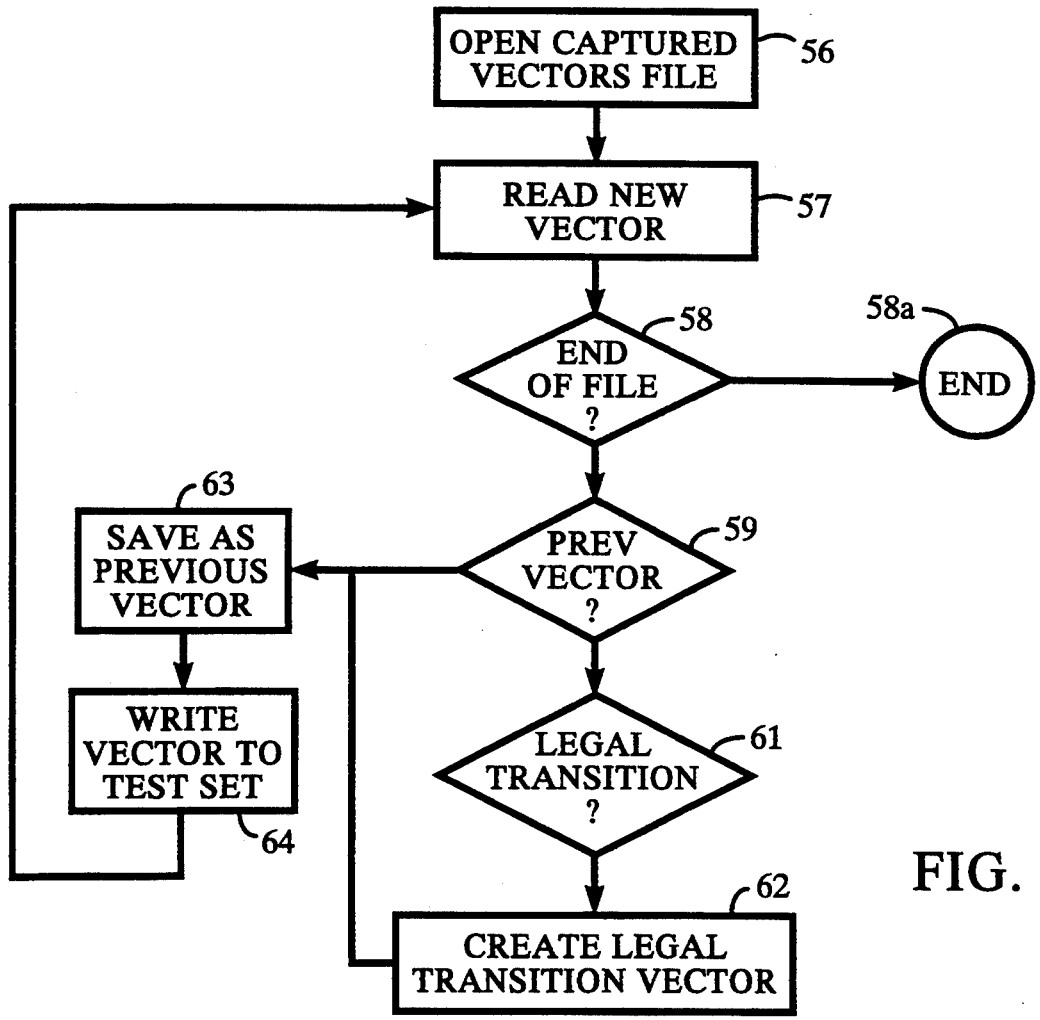
FIG. 6 is a detailed block diagram illustrating a method for removing hazard conditions from the test vector set described in FIG. 5.

The method for removing hazards from the file is shown in more detail in FIG. 6. At step 56, the test set 50 (FIG. 5) (captured during simulation) is provided. A new vector is read from the test set 50 at step 57. At step 58, the process determines whether it has finished processing the entire test set 50. If not, at step 59 it is determined whether the new vector read at step 57 is the first vector of test set 50 by examining a previous vector register (not shown) to determine if a previous vector had been saved. If there is not a previous vector, as would be the instance in processing the first test vector of the test set 50, at step 63 the first test set vector is saved as the previous test vector in the previous test vector register. If however, the new test vector provided at step 57 is not the first test vector of the test set, it is compared against the test vector saved in the previous test vector register to determine whether both the clock and the data had changed in the new test vector provided by step 57. A first look up table is used to store the integrated circuit pin numbers corresponding to respective input or output signals. A dependency table is used to identify pin dependencies, such as which data signal are related to given clocking signals. For example, if pin number 1 is the clock pin, and pins 12-15 are data pins which are received by the state device driven by clock pin number 1, this is indicated in the dependency table. The tables are used to determine if a data pin changes during the same cycle as its related clock pin. If it is found that the data and the clock change in the same cycle, at step 62 an extra test vector provided.

The test vector which is provided is dependant on the state of the clock pin. If the bit element value of the clock pin changed from a '0' in the previous vector to a '1' in the new vector provided at step 57, (and the flip flop which receives the data during the given cycle is triggered by a rising edge clock), the extra test vector provided at step 62 is a test vector in which the bit elements representing the clock pin remain stable but the bit elements representing the data bits change, thus allowing for the setup constraints of the receiving latch to be met. If the bit element value of the clock pin changed from a '1' in the previous vector to a '0' in the new vector provided at step 57, then the extra test vector provided at step 62 is a test vector in which the bit elements representing the data pins remain stable but the bit elements representing the clock pins change, thus allowing for the hold time constraints of the receiving latch to be met.

This newly provided test vector is then saved at step 63 as the previous vector and is written to the test vector set. The process of reading a new vector, comparing it against the previous vector, detecting a setup or hold violation and fixing it continues until the end of file is determined at step 58. The end of file is determined by reading the last entry existing in the test set. At this point, the corrected test vector set has been provided and may be loaded into the memory device 20 of FIG. 1. Thus a corrected test vector set has been provided while maintaining the fewest possible number of test vectors within the test set.

It should be noted that while the above discussion referred to setup and hold time violations for clocked inputs, the invention is also effective when used in conjunction with the testing of asynchronous, unclocked circuits. Asynchronous circuits are commonly used as interfaces between circuits operating under different protocols, and as such are designed with an understanding of the dependencies between the two protocols, that is the amount of time required for a circuit operating under one protocol to respond to the a signal driven by another circuit operating under a second protocol.

As discussed previously, due to the method used to capture simulation vectors, the dependencies between the protocols may not be reflected in the captured test set. When the dependencies are not accounted for by delays between input signal assertions, a hazard condition may occur. A hazard condition is an unwanted transient change in an input signal which momentarily causes and output signal to enter an incorrect state. The occurrence of a pattern in the test set which could result in a hazard condition may cause an otherwise operable asynchronous circuit to fail during testing.

The present invention may also be used to remove patterns which could cause hazards in an asynchronous circuit as follows. Referring now to Table 3, for example, the logical states of four input signals A,B,C,D captured test vectors are shown. Although in simulation the input signals may have changed with sufficient time allowance in between the changes to satisfy the dependencies of the asynchronous circuit, it is not reflected in the captured test vector. If the dependency of the asynchronous circuit for which A-D are inputs is such that neither A,B,C, or D are expected to change at the exact same instant in time, a hazard condition would most likely occur with the following sequence of test vectors:

TABLE 3

|  | A | B | C | D |
|---|---|---|---|---|
| test vector 1 | 1 | 0 | 0 | 1 |
| test vector 2 | 0 | 1 | 1 | 0 |

By identifying the dependencies of the signals in the dependency table described above, the present invention may correct the hazard problem as described above. For example, if 'A' is the reference signal of this example, the present invention determines at step 61 that test vector 2 has an illegal transition. At step 62, a new transition vectors 1, 2, and 3 (shown in Table 4) are provided until the dependencies between test vector 1 and test vector 2 of Table 3 are met. The result of the operation is shown in Table 4.

TABLE 4

|  | A | B | C | D |
|---|---|---|---|---|
| test vector 1 | 1 | 0 | 0 | 1 |
| new test vector 1 | 0 | 0 | 0 | 1 |
| new test vector 2 | 0 | 1 | 0 | 1 |
| new test vector 3 | 0 | 1 | 1 | 1 |
| test vector 2 | 0 | 1 | 1 | 0 |

Thus, no more than one input to the asynchronous circuit changes for each test vector of the test set, and therefore the test set will not provide a pattern which may cause a hazard condition during testing of the integrated circuit.

Figure 7:
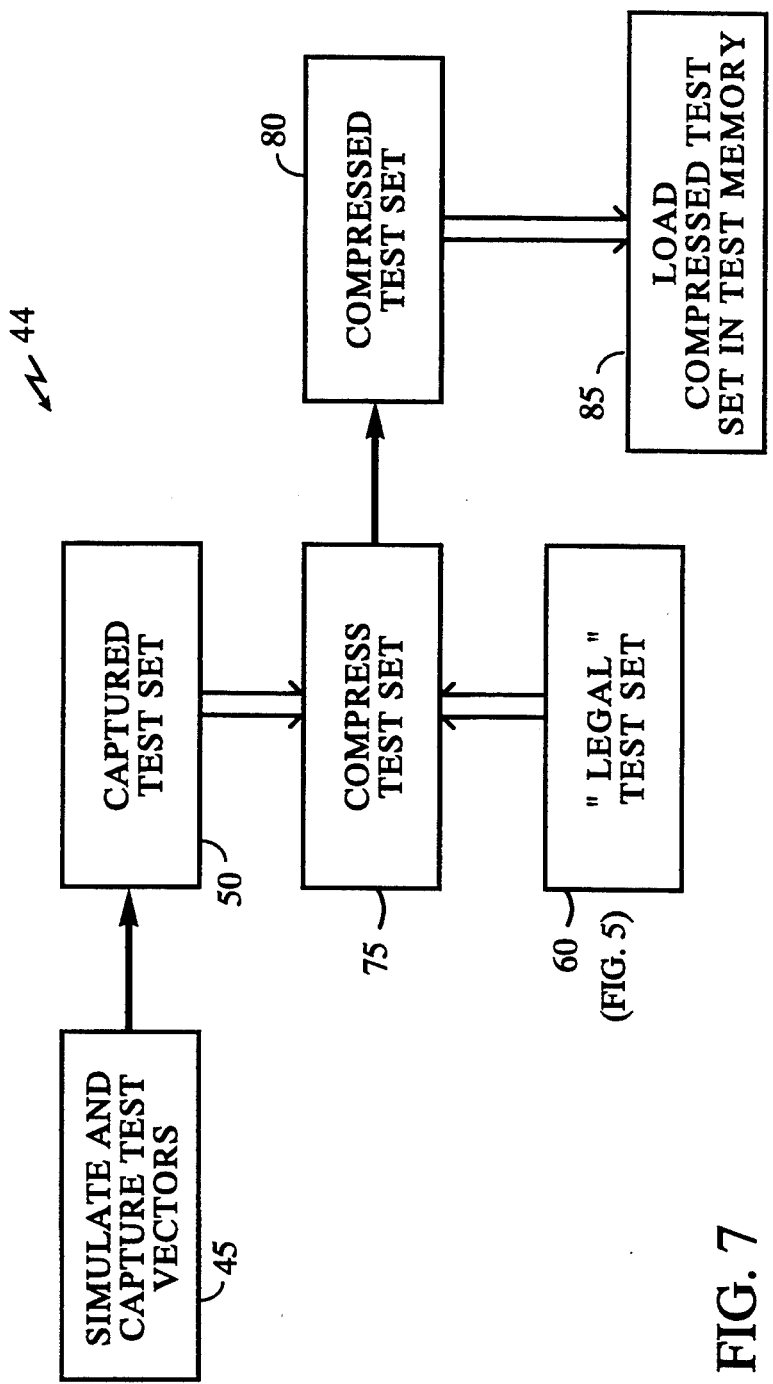
FIG. 7 is a block diagram illustrating another embodiment of the method of the present invention for providing a test vector set for use in the tester apparatus of FIG. 1.

Referring now to FIG. 7, an alternative arrangement to provide a minimal number of test vectors which adequately and completely test the integrated circuit 15 is shown. Here an additional step is provided in the process. The captured test set is compressed to remove unnecessary test vectors. Unnecessary test vectors are test vectors in which none of the external pin values change from one test vector to the next. These types of test vectors may arise in various instances in simulation. For example, if the integrated circuit being tested is associated with a memory device, often hardware may choose to stall the clocks which are fed to the integrated circuit while the integrated circuit waits for data to return from memory. Thus, many cycles wherein neither the clock pins nor the data pins at the integrated circuit change may be captured in the test set. Such vectors are herein referred to as 'dead vectors'. The dead vectors are not necessary to verify the integrity of the functional blocks within the integrated circuit, and when the integrated circuit is being tested individually they may be removed from the test vector set.

The process 44 for providing a test vector set with the dead vectors removed includes the step of simulating and capturing the test vectors to provide a captured test set 50. Either the captured test set 50 or the corrected test set (provided by the process described with reference to FIGS. 5 and 6) may be compressed at compressing step 75. As mentioned previously the compression step 75 removes dead vectors to provide a compressed test set 80 which is the smallest test set which may be provided to sufficiently test integrated circuit 15. This compressed test set 80 is then loaded into test memory 20 (FIG. 1), thus ensuring that the integrated circuit functionality is completely tested with the smallest test set possible.

Figure 8:
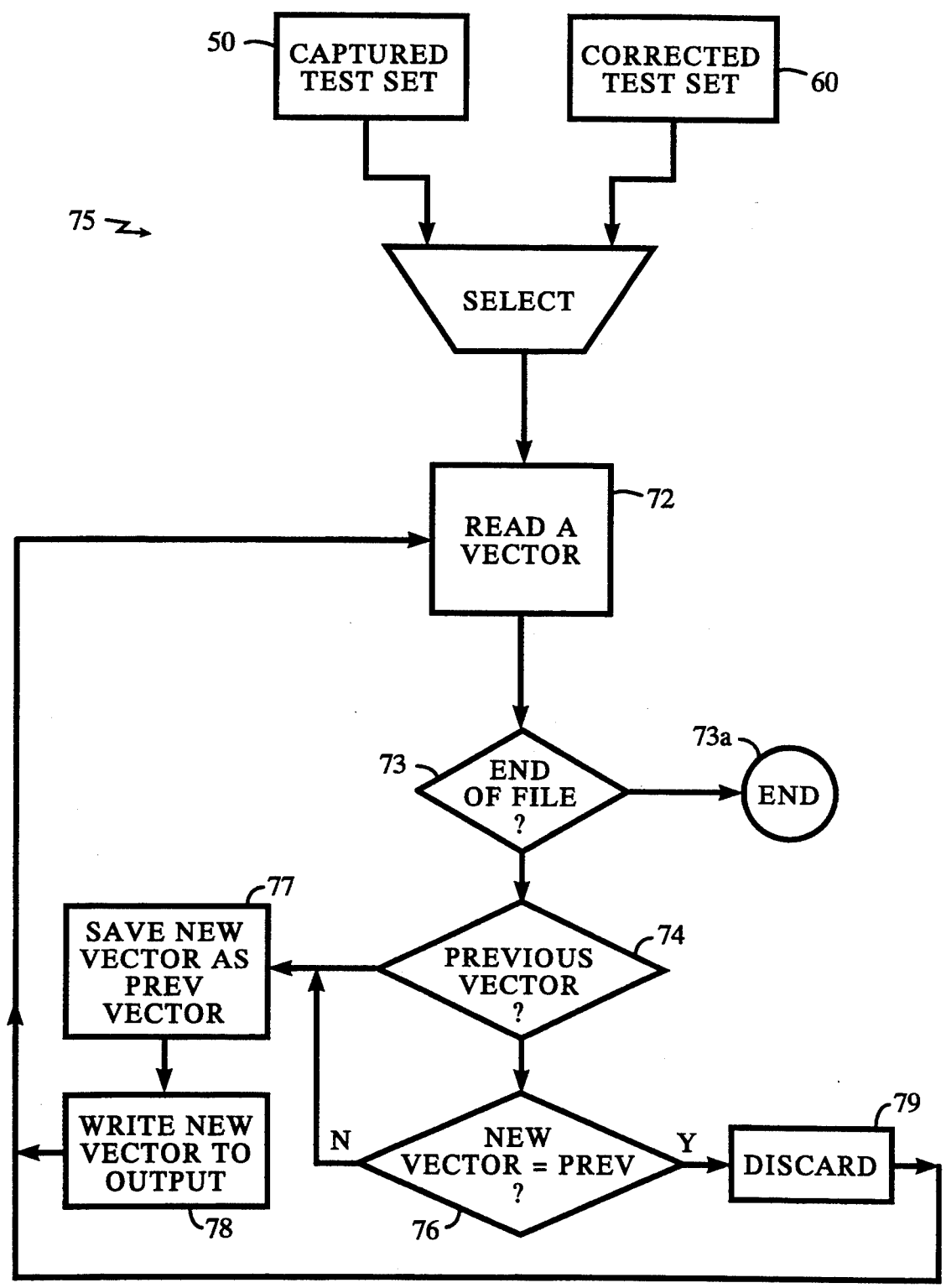
FIG. 8 is a detailed block diagram illustrating the a method for providing a compressed test vector set described in FIG. 7.

Referring now to FIG. 8, the compression step 75 operates as follows. A new test vector is provided from either the test set 50 provided by the computer simulation, or the corrected test set 60 at step 72. At step 73, it is determined whether the compression step 75 has been completed on the processed test set. If the processing of the test set used in step 72 has not been completed, then at step 74 the it is determined whether a previous vector was processed. If the new test vector is the first one of the test set, it is saved in a previous vector register (not shown) at step 77 and at step 78 it is written to test vector output file 80 (FIG. 7). If, however, the new test vector is not the first vector of the test set there is a previous vector stored in the previous vector register, and at step 76 the new vector is compared against the previous vector to determine if all the bit elements are equal. If the bit elements of the two vectors are not equal, the new test vector is saved in the previous vector register at step 77 and at step 78 the new vector is written to the vector output file 80. If the bit elements of the two vectors are all equal, however, at step 79 the new test vector is discarded and the compress process 75 proceeds to obtain the next test vector from the test set at step 72. The above described process continues until, at step 73, it is determined that the entire test vector set is processed, wherein at step 73A the compress process is completed.

Thus, a method of optimizing test vector generation includes providing a process to accurately identify hazard conditions in the test set and inserting test vectors only where absolutely necessary in order to ensure complete fault coverage. In addition a method for reducing the overall number of test vectors within a test set by removing redundant vectors ensures that the fewest number of test vectors possible are used to guarantee the functioning of an integrated circuit.

Having described a preferred embodiment of the invention, it will now become apparent to one of skill in the art that other embodiments incorporating its concepts may be used. It is felt, therefore, that this embodiment should not be limited to the disclosed embodiment, but rather should be limited only by the spirit and scope of the appended claims.

What we claim is:

1. A method of testing an integrated circuit having a plurality of pins comprising the steps of:

providing an ordered plurality of test strings each string having a plurality of elements with each element of said test string corresponding to one of said plurality of pins of said integrated circuit;

locating an undesirable pattern in said ordered plurality of test strings; and modifying the located undesirable pattern in said ordered plurality of test strings to correct said undesirable pattern, said step of modifying including the step of adding a test string to said located undesirable pattern.

2. The method of claim 1 further including the step of applying said modified ordered plurality of test strings to said integrated circuit.

3. The method of claim 1, wherein said located undesirable pattern is a pattern with both a reference element and at least one related element differeing in consecutive test strings.

4. The method of claim 3, wherein said step of locating said undesirable pattern further comprises the steps of:

identifying a plurality of reference pins of said integrated circuit;

identifying a plurality of groupings of data pins of said integrated circuit related to said plurality of reference pins; and locating ordered pairs of first and second test strings wherein said element values of said plurality of reference pins and at least one said elements values of said related data pins differ in said second test string of said test string pair relative to said first test string.

5. The method of claim 3, wherein said step of modifying further comprises the steps of:

providing a third test string having element values matched to said second test string;

inverting said reference pin element values corresponding to said at least one related data pins; and inserting said third test string between said first test string and said second test string in said ordered plurality of test strings.

6. The method of claim 3, wherein said step of modifying further comprises the steps of:
providing a third test string having element values matched to said first test string;
inverting said reference pin element values related to said at least one different data pins; and
inserting said third test string between said second test string and a subsequent one of said ordered plurality of test strings.

7. The method of claim 3, wherein said located undesirable pattern is a redundant pattern.

8. The method of claim 3, wherein said step of locating a predetermined pattern further comprises the step of:
locating sequential test string pairs wherein said element values of said first and second test string are identical.

9. The method of claim 3, wherein said step of modifying further comprises the step of removing said second test string having element values identical to said first test string from said test set.

10. The method of claim 2, wherein said step of applying said modified ordered plurality of test strings to said integrated circuit further comprises the steps of:
storing said modified ordered plurality of test strings in a memory device; and
providing signals from said memory device to said integrated circuit, wherein said signal value is related to said element value of said test string.

11. A method of testing an integrated circuit having a plurality of pins comprising the steps of:
providing an ordered plurality of test strings each string having a plurality of elements with each element of said test string corresponding to one of said plurality of pins of said integrated circuit;
comparing corresponding elements of sequential test strings to locate a first undesirable pattern corresponding to a setup time violation in said ordered plurality of test strings;
comparing corresponding elements of sequential test strings to locate a second undesirable pattern corresponding to a hold time violation in said ordered plurality of test strings;
modifying said first and second undesirable patterns of said ordered plurality of test strings said step of modifying said first and second undesirable patterns including the step of adding a test string to said located undesirable pattern;
modifying said ordered plurality of test strings by removing selected test strings with the values of each of the elements of a selected test string being equal to values of corresponding elements of a previous test string in said ordered plurality of test strings; and
applying said modified ordered plurality of test strings to said integrated circuit.

12. The method of claim 11 wherein the step of locating a first and second undesirable patterns includes the steps of:
identifying elements in said plurality of test strings corresponding to a plurality of clock pins of said integrated circuit;
identifying a plurality of groupings of data pins of said integrated circuit, with each of said plurality of groupings of data pins being related to one of said plurality of clock pins; and
locating ordered pairs of first and second test strings wherein the value of at least one of said plurality of clock pins differs in said first and second test string and the value of at least one data pin of said related grouping of data pins differs in said first and second test string.

13. The method of claim 12, wherein said step of modifying said ordered plurality of test strings to correct said first undesirable pattern comprises the steps of:
providing a third test string with the values of the elements in said third test string being matched to the values of the elements of said second test string;
inverting the value of the element in the test string corresponding to the clock pin which is related to said at least one different data pin; and
inserting said third test string between said first test string and said second test string in said ordered plurality of test strings.

14. The method of claim 12, wherein said step of modifying said ordered plurality of test strings to correct said second undesirable pattern comprises the steps of:
providing a third test string with the values of the elements of the third test string being matched to the values of the elements in the second test string;
inverting the value of the element corresponding to the clock pin which is related to said at least one different data pins; and
inserting said third test string between said second test string and a subsequent test string in said ordered plurality of test strings.

15. An apparatus for testing an integrated circuit having a plurality of pins comprising input pins and output pins, said apparatus comprising:
a socket device for supporting said integrated circuit;
comparison means, coupled to said socket device, for receiving data from said integrated circuit;
a memory device, coupled to said socket device and said comparison means, containing an ordered plurality of test strings each test string having a plurality of elements with each element of said test string corresponding to one of said plurality of pins of said integrated circuit, with a plurality of said input pins corresponding to clock pins of the integrated circuit, and a plurality of said input pins corresponding to data pins of said integrated circuit, and with a plurality of said data pins being related to at least one of said clock pins of said integrated circuit, and wherein said ordered plurality of test strings includes no ordered pairs of test strings having both the element values corresponding to the clock pins and the element values corresponding to the related data pins differ in sequential test strings; and
said ordered plurality of test strings includes no ordered pairs of test strings wherein said element values of sequential test strings are identical.

16. The apparatus of claim 15, wherein said comparison means further comprises:
means for controlling said memory device to provide said test string elements corresponding to said input pins of said integrated circuit to said integrated circuit;
means for receiving said test string elements corresponding to said output pins of said integrated circuit from said memory device;
means for receiving output signals from said integrated circuit device; and
means for comparing said received test string elements to said corresponding output signals of said integrated circuit to identify a fault condition of said integrated circuit.

* * * * *